United States Patent [19]

Schelhorn

[11] 4,331,700
[45] May 25, 1982

[54] METHOD OF MAKING A COMPOSITE SUBSTRATE

[75] Inventor: Robert L. Schelhorn, Cinnaminson, N.J.

[73] Assignee: RCA Corporation, New York, N.Y.

[21] Appl. No.: 258,433

[22] Filed: Apr. 28, 1981

Related U.S. Application Data

[62] Division of Ser. No. 98,927, Nov. 30, 1979, Pat. No. 4,296,272.

[51] Int. Cl.³ .............................................. H05K 3/46
[52] U.S. Cl. ........................................ 427/8; 427/96; 427/123; 427/266; 29/850; 29/851
[58] Field of Search ...................... 427/266, 96, 8, 123, 427/227, 265, 269, 404, 383.5; 174/68.5; 361/402, 406; 29/850, 851

[56] References Cited
U.S. PATENT DOCUMENTS

| | | | |
|---|---|---|---|
| 3,317,653 | 5/1967 | Layer | 361/402 X |
| 3,423,517 | 1/1969 | Arrhenius | 174/68.5 |
| 3,424,698 | 1/1969 | Lupinski | 174/68.5 X |
| 3,549,784 | 12/1970 | Hargis | 174/68.5 |
| 3,617,744 | 11/1971 | Irish | 174/68.5 X |
| 3,770,529 | 11/1973 | Anderson | 29/851 X |
| 3,844,831 | 10/1974 | Cass | 174/68.5 X |
| 3,978,248 | 8/1976 | Usami | 427/123 X |
| 4,237,606 | 12/1980 | Niwa | 174/68.5 X |

Primary Examiner—John D. Smith
Assistant Examiner—Bernard F. Plantz
Attorney, Agent, or Firm—Samuel Cohen; Robert L. Troike; Robert Ochis

[57] ABSTRACT

An improved composite substrate comprises a patterned surface conductive layer of a refractory metal and a patterned compensation electrically conductive layer. The patterned compensation layer entirely overlies and extends beyond the shrunken patterned conductive layer. Additionally, thick film elements such as resistors are fabricated and contact selected areas of the patterned compensation conductive layer.

4 Claims, 2 Drawing Figures

METHOD OF MAKING A COMPOSITE SUBSTRATE

This is a division, of application Ser. No. 98,927 filed Nov. 30, 1979, now U.S. Pat. No. 4,296,272.

This invention generally relates to composite substrates and, in particular, relates to an improved composite substrate having means integral therewith for compensating for the inherent shrinkage which occurs during fabrication.

In general a composite substrate is one which comprises a multiplicity of conductive layers, interleaved with layers of an electrically insulating material. Each of the multiple conductive layers is usually formed on unfired, or "green", ceramic material. The ceramic material is electrically insulating and serves to electrically isolate the conductive layers from each other. The green ceramic layers are then stacked and thereafter the stacked substrate is fired as a unit. The conductive layers are usually interconnected through the insulating layers by using known techniques. For example, one technique includes providing openings through the insulating layers at predetermined locations and filling such openings with an electrically conductive material. A patterned conductive layer is formed on one major surface of the substrate and is generally a multilayered configuration. This patterned conductive layer usually includes, as a first layer, a refractory metal, such as tungsten, contiguous with the ceramic surface. The tungsten layer is ordinarily formed on the major surface of the substrate prior to it being fired. After the composite substrate is fired, an intermediate layer, such as nickel, usually is formed over the tungsten. Additionally, a comparatively thin layer of gold is formed on the nickel and overlies the tungsten and nickel layers. The patterned conductive layer further includes a plurality of contact areas which are distributed about the periphery of the major substrate surface or at least along one edge thereof. The contact areas provide a means for connecting the substrate circuitry to an external circuit. The detailed structural features of one such composite substrate and its method of fabrication are described in U.S. Pat. No. 3,549,784, issued on Dec. 22, 1970 to Billy M. Hargis.

Composite substrates can be fabricated in high volume at greatly reduced costs compared to conventional thick film circuits. In addition, composite substrates have the potential to increase the circuit density per volume in this technological field. Currently, however, these composite substrates are generally restricted to uses requiring relatively few interconnection patterns incorporating circuit designs which are restricted to simple patterns. Further, prefabricated integrated circuit elements, such as resistors or capacitors, must be used since such elements can not presently be formed on the patterned conductive layer of these substrates because the atmosphere and firing temperatures of these elements are not compatible therewith.

Although the use of composite substrates is currently limited to the above restrictions on size and complexity, the technology required to fabricate large area, high density complex circuits is in existence. However, this technology is presently impractical because the composite substrate sustains considerable uncontrolled shrinkage during the firing thereof.

This shrinkage, particularly when linear distances between from 4 to 6 centimeters or more are involved, has been found to cause at the very least a slight, and frequently a complete, misalignment between the contact areas of the composite substrate and the leads of a standardized connector. Because the amount of shrinkage varies from substrate to substrate and to a greater degree, from lot to lot, the use of automatic testing equipment to evaluate circuits made on composite substrates is severely restricted.

Another impediment to the wider use of composite substrates derives from the fact that they are generally fabricated on relatively large pieces of multilayer ceramic substrate material. These large pieces are subsequently separated to form a plurality of smaller final composite substrates. After separation, the location of the line of the break with respect to a reference edge is often inconsistent. This lack of a common reference point further reduces the alignment of external contacts and further restricts the use of automatic testing equipment. The need to employ automatic testing equipment is extremely important for testing high density circuit patterns and for high volume production requirements. This is because it is essential, especially for large volume fabrication, to automatically probe the circuit boards and test the circuit both before and after assembly.

An additional limitation on the use of composite substrates is that they are not presently compatible with the use of integrally fabricated thick film circuit elements, such as resistors. This is primarily due to the nature of the surface conductive layer of the composite substrate which creates processing difficulties. One major difficulty evolves from the presence of the refractory metal which, because of its attendant oxidation characteristics, makes it difficult to fabricate thick film elements thereon. Further, the temperature at which some thick film elements are fired is sufficiently high enough to cause the interdiffusion of the aforementioned gold and nickel layers of the surface conductive layer.

In accordance with the preferred embodiment of the invention, an improved composite substrate comprises a patterned conductive compensation layer entirely covering and extending beyond the shrunken patterned layer by an amount about equal to the degree of shrinkage of the original patterned layer.

Figure 1:
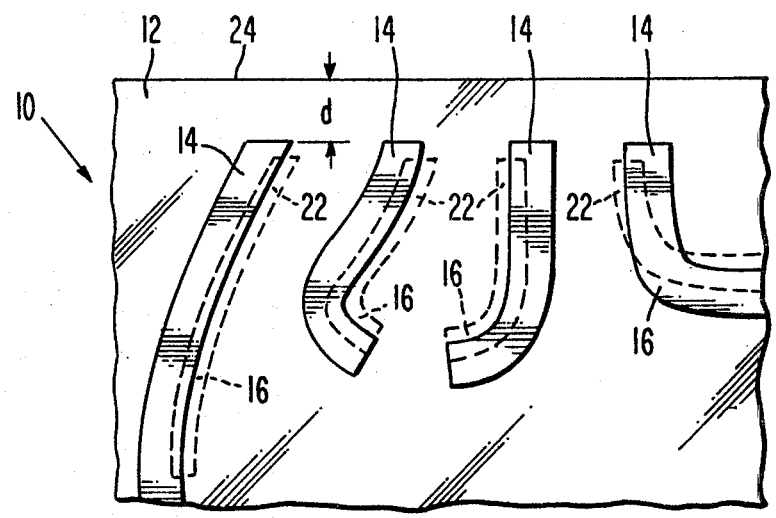
FIG. 1 is a plan view of a patterned conductive layer on a surface of a composite substrate before and after the firing thereof.
Figure 2:
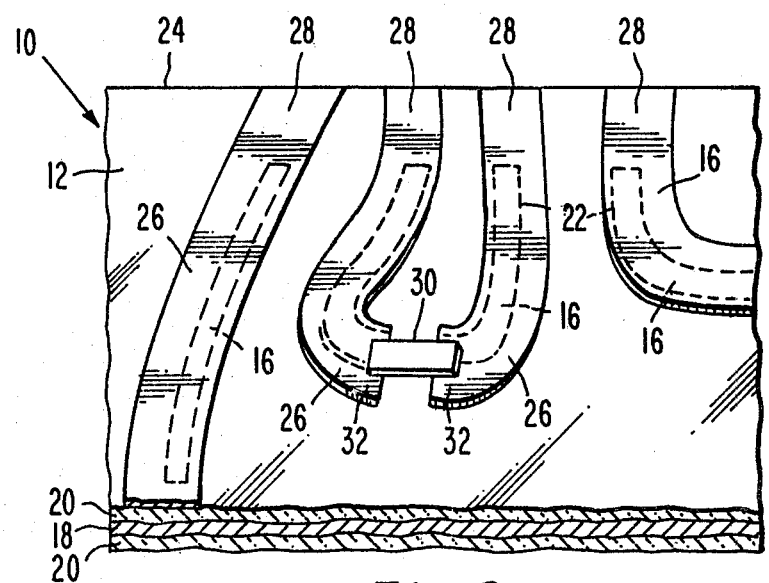
FIG. 2 is a perspective view of the composite substrate shown in FIG. 1 including a patterned conductive compensation layer Referring particularly to FIG. 1 of the drawing, a composite substrate, indicated generally at 10, is shown in plan view. On an insulative surface 12 of the composite substrate 10 is shown a patterned conductive layer 14 which is depicted by solid lines and represents a circuit pattern, usually comprised of a refractory metal, as it is originally formed on the surface 12. In order to withstand the ceramic firing temperatures used during the firing of the composite substrate 10 a refractory metal is generally required for any conductive circuitry used therein. As discussed above, during the firing of the composite substrate 10 the entire substrate 10 and thus the original patterned conductive layer 14 shrinks. The shrunken or deformed, patterned conductive layer 16 is represented by the dashed lines in FIGS. 1 and 2. For the reasons mentioned above, the direct use of this shrunken patterned conductive layer 16 is unacceptable.

As fully shown in FIG. 2, the improved composite substrate 10 is a multi-layered composite substrate having a plurality of electrically conductive layers 18, each having a preselected pattern, interleaved with a plurality of electrically insulating layers 20.

As described above, the composite substrate 10 includes an insulative surface 12 having a shrunken patterned conductive layer 16 contiguous therewith which is connected to the electrically conductive layers 18 via known techniques. In order to withstand the temperature required for firing ceramic material, the patterned conductive layer 14 is a refractory metal, i.e. a metal having the ability to substantially retain its physical shape and chemical identity when subjected to temperatures on the order of about 1650° C.

The shrunken patterned conductive layer 16 includes a plurality of contact areas 22 which are used as points for the connection between the patterned conductive layer 16, i.e. the circuitry of the composite substrate 10, and an external connector, not shown. Preferably, the contact areas 22 terminate on the surface 12 at a preselected distance "d" from an edge 24 of the surface 12 of the composite substrate 10. The distane "d" at which these contact areas 22 terminate from the edge 24 is more fully discussed below. It is understood that ordinarily such contact areas would extend to the edge 24 of the substrate 10. The contact areas 22 terminate at preselected locations which are determined by the size of and location of the pad patterns on the external packages. For clarity, the original unfired patterned conductive layer 14 is not shown in FIG. 2.

A patterned conductive compensation layer 26 overlies at least the entire shrunken patterned surface conductive layer 16 and is similar thereto. Additionally, the patterned conductive compensation layer 26 is sized such that it provides conductive paths substantially identical to the original preshrunken patterned conductive layer 16. As a result, the patterned conductive compensation layer 26 extends beyond the shrunken patterned surface conductive layer 16 where compensation for shrinkage is required to return the surface pattern to its original path. That is, the patterned conductive compensation layer 26 overlaps the shrunken patterned surface conductive layer 16. The use of the patterned conductive compensation layer 26 thus permits the use of, and connection to, standardized external edge connectors. In addition, the inclusion of the patterned conductive compensation layer 26 permits the use of standardized multiprobe automatic testing equipment. The patterned conductive compensation layer 26 must entirely overlie the shrunken patterned surface conductive layer 16 of refractory metal to avoid the deterioration thereof due to exposure to adverse ambients. For example, tungsten deteriorates rather rapidly in an oxygen or salt water environment and, if not entirely covered by a conductive material, would require an overcoating of some dielectric sealing material. Further, since tungsten has a comparatively low conductivity, the necessity for the patterned conductive compensation layer 26 to overlie the entire shrunken patterned surface conductive layer 16 is additionally important if the composite substrate 10 is to be used in high power applications.

The degree, or percentage, of extension of the pattern of the compensation conductive layer 26 beyond the shrunken pattern of the surface conductive layer 16 of the composite substrate 10 is directly related to the degree, or percentage of shrinkage of the original pattern of the surface conductive layer 14. The shrinkage, which is usually between 5 and 10 percent of the linear dimensions, occurs when the layers 18 and 20, of the composite substrate 10 is initially fired. The pattern of the compensation conductive layer 26 also comprises a plurality of contact areas 28 which overlie and electrically contact the contact areas 22 of the shrunken patterned surface conductive layer 16. The contact areas 28 of the compensation conductive layer 26 extend to the edge 24 of the composite substrate 10.

At least one thick film element 30, for example a resistor, contacts preselected areas 32 of the patterned compensation conductive layer 26. The element 30, as more fully described hereinafter, is preferably fabricated by a method whereby the shrunken patterned surface conductive layer 16 remains substantially unimpared.

The composite substrate 10 described above can be fabricated using known methods in the art. The substrate 10, when formed, should have a patterned surface conductive layer 16 which is a refractory metal. Further, in one example, the original patterned surface conductive layer 14 should be designed so that prior to firing, the contact areas 22 are about 50 micrometers in width on predetermined centers and are spaced apart from a preselected edge 24 by a distance "d" of about 0.25 centimeters.

The patterned compensation conductive layer 26 is formed over the shrunken patterned conductive layer 16 using a pattern substantially identical thereto. Although other conductive materials can be used for the patterned compensation conductive layer 26, copper is preferred because of its campatibility with known thick film processing techniques. The mask utilized for screening the copper onto the surface 12 of the composite substrate 10 should be designed to produce a copper pattern which is similar to and generally following the original pattern of the surface conductive layer 14. The copper pattern is then configured to a standardized circuit configuration of known standardized dimensions to make the compensation conductive layer 26 compatible with probe point locations of automatic circuit testing equipment and edge pad locations standard connector dimensions. This copper pattern is determined by performing optical measurements to initially determine the degree, or percent, of shrinkage of the original patterned conductive layer 14 of the composite substrate 10. Thereafter, the patterned compensation conductive layer 26 is arranged to contact the contact area pattern, i.e. the original external contact areas 22 and the element contact areas 32. The copper compensation conductive layer 26 is screened, using known thick film screening techniques, onto the substrate 10 using screens having between 325 to 400 mesh. Then the compensation conductive layer 26 is fired at a temperature of about 900° C. for about 10 minutes.

Thick film elements 30, i.e. electrical elements which are formed on the composite substrate 10, as compared to discrete elements which are fabricated externally and then simply connected by using low temperature solder techniques, can now be fabricated on the compensation conductive layer 26 using known thick film printing techniques. Such techniques include the utilization of a nonoxidizing atmosphere, such as for example, a nitrogen atmosphere. A nonoxidizing atmosphere is necessary to preserve the chemical and electrical identity of the refractory metal, i.e. tungsten, which would otherwise deteriorate, e.g. oxidize, during the firing of the thick film resistor ink. In addition, it is recommended that the nickel and gold layers, if initially present, be removed using known chemical techniques, since the temperature necessary for the firing of the resistor ink, i.e. between 750° to 800° C., would almost certainly cause interdiffusion between the nickel and gold comprising those layers. Preferably, however, the nickel and gold layers are simply not formed.

Improved composite substrates embodying the principles of the present invention permit the fabrication of circuits having more flexibility and also ensure accurate alignment of the composite substrate to external connectors and automated test equipment.

What is claimed is:

1. A method of fabricating an improved thick film composite substrate comprising the steps of:
   providing a composite substrate having a plurality of patterned conductive layers interleaved with a plurality of electrically insulative ceramic layers and having been fired to form a shrunken patterned conductive layer of refractory material on one major surface of said substrate;
   measuring the degree of said shrinkage;
   generating, based on the determined degree of shrinkage, a thick film mask of a patern which compensates for said shrinkage; and
   forming on said surface, by using said mask, a patterned conductive compensation layer which is generally like that of said shrunken patterned conductive layer and entirely covers and extends beyond said shrunken patterned conductive layer of refractory material by an amount about equal to the degree of shrinkage.

2. The method as claimed in claim 1 wherein and said forming step comprises forming a thick film patterned conductive compensation layer.

3. A method as claimed in claim 2 further includes the steps of:
   forming a thick film element between preselected contact areas on said patterned conductive compensation layer.

4. A method as claimed in claim 3 wherein said element forming step includes firing a deposited thick film resistive ink in a non-oxidizing atmosphere.

* * * * *